(12) United States Patent
Peng et al.

(10) Patent No.: US 7,443,680 B1
(45) Date of Patent: Oct. 28, 2008

(54) HEAT DISSIPATION APPARATUS FOR HEAT PRODUCING DEVICE

(75) Inventors: Xue-Wen Peng, Shenzhen (CN); Rui-Hua Chen, Shenzhen (CN)

(73) Assignees: Fu Zhun Precision Industry (Shen Zhen) Co., lts., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/696,682

(22) Filed: Apr. 4, 2007

(51) Int. Cl.
*H05K 7/20* (2006.01)
*F28D 15/00* (2006.01)

(52) U.S. Cl. ............... 361/704; 361/695; 361/697; 361/700; 361/709; 165/80.3; 165/104.33; 165/185

(58) Field of Classification Search ......... 361/694–695, 361/697, 699–704; 165/80.3–80.5, 104.33, 165/185; 174/15.2, 16.1, 16.3; 454/184
See application file for complete search history.

(56) References Cited

U.S. PATENT DOCUMENTS

| | | | |
|---|---|---|---|
| 6,373,700 B1 * | 4/2002 | Wang | 361/698 |
| 6,450,251 B1 * | 9/2002 | Lin et al. | 165/122 |
| 6,501,651 B2 * | 12/2002 | Lin et al. | 361/697 |
| 6,512,673 B1 * | 1/2003 | Wiley | 361/695 |
| 6,704,199 B2 * | 3/2004 | Wiley | 361/695 |
| 7,040,384 B2 * | 5/2006 | Shiang-Chich | 165/122 |
| 7,085,134 B2 * | 8/2006 | Foster et al. | 361/695 |
| 7,165,603 B2 * | 1/2007 | Mochizuki et al. | 165/104.21 |
| 7,304,846 B2 * | 12/2007 | Wang et al. | 361/700 |
| 7,385,820 B1 * | 6/2008 | Chen | 361/704 |
| 2002/0003690 A1 | 1/2002 | Lin et al. | |
| 2002/0185259 A1 * | 12/2002 | Park | 165/80.3 |
| 2007/0151711 A1 * | 7/2007 | Chen et al. | 165/104.33 |

* cited by examiner

*Primary Examiner*—Jayprakash N Gandhi
*Assistant Examiner*—Robert J Hoffberg
(74) *Attorney, Agent, or Firm*—Frank R. Niranjan

(57) ABSTRACT

A heat dissipating apparatus for dissipating heat generated by heat producing device, includes a base, a fin set and an axial fan. The base is secured on the heat producing device. The fin set comprises a plurality of fins arranged on the base; the fins are spaced apart from and oriented parallel to each other, and form a plurality of air passages therebetween. The axial fan is installed at a lateral side of the fin set and directs airflow into the fin set through the air passages. The fin set has an inclined area at an end thereof, and the fan is installed on the inclined area of the fin set and oblique to the base.

15 Claims, 2 Drawing Sheets

HEAT DISSIPATION APPARATUS FOR HEAT PRODUCING DEVICE

BACKGROUND OF THE INVENTION

1. Field of the Invention

The present invention relates to a heat dissipating apparatus for heat producing device and particularly to a heat dissipating apparatus mounted onto a processor such as, for example, a VGA (video graphics array) card, for dissipating heat generated during operation of the processor.

2. Description of Related Art

When electronic components operate at high speed they generate a mass of heat. Generally, it is desirable to employ a heat dissipating apparatus to remove the heat from these electronic components, to assure that the components function properly and reliably. A typical heat dissipating apparatus comprises a base for contacting the electronic component so as to absorb the heat generated by the electronic component, a plurality of fins extending from the base, and a centrifugal fan horizontally installed at a lateral side of the fins for providing airflow through the fins to remove the heat from the fins into ambient air.

Generally, space surrounding a computer add-on device such as a VGA card is quite limited, and the centrifugal fan of the heat dissipating apparatus horizontally fixed to the lateral side of the fins of the heat dissipating apparatus not only takes up a large area around the VGA card thus severely restricting the size of the fins, but also limits airflow to central areas of the base of the heat dissipating apparatus where most heat absorbed from the electronic component is accumulated, thereby inhibiting heat dissipating efficiency of the heat dissipating apparatus.

Accordingly, what is needed is a heat dissipating apparatus having a fan installed which doesn't restrict the size of the fins and allows airflow to be distributed to high temperature areas of the heat dissipating apparatus.

SUMMARY OF THE INVENTION

According to a preferred embodiment of the present invention, a heat dissipating apparatus configured for dissipating heat generated by heat producing device such as an add-on device, includes a base, a fin set and an axial fan. The base can be attached to the heat producing device and contacts with a heat producing element of the heat producing device, such as, for example, a processor in the add-on device. The fin set comprises a plurality of fins arranged on the base; the fins are spaced apart from and parallel to each other and form a plurality of air passages therebetween. The axial fan is installed on a lateral side of the fin set and blows airflow into the fin set through the air passages. The fin set defines an inclined plane at an end thereof, and the axial fan is installed on the inclined plane of the fin set and oblique to the base, whereby the axial fan can have a larger size to provide an airflow with a larger flow rate through the fins to effectively remove heat therefrom.

Other advantages and novel features of the present invention will become more apparent from the following detailed description of preferred embodiment when taken in conjunction with the accompanying drawings.

DETAILED DESCRIPTION OF THE INVENTION

Figure 1:
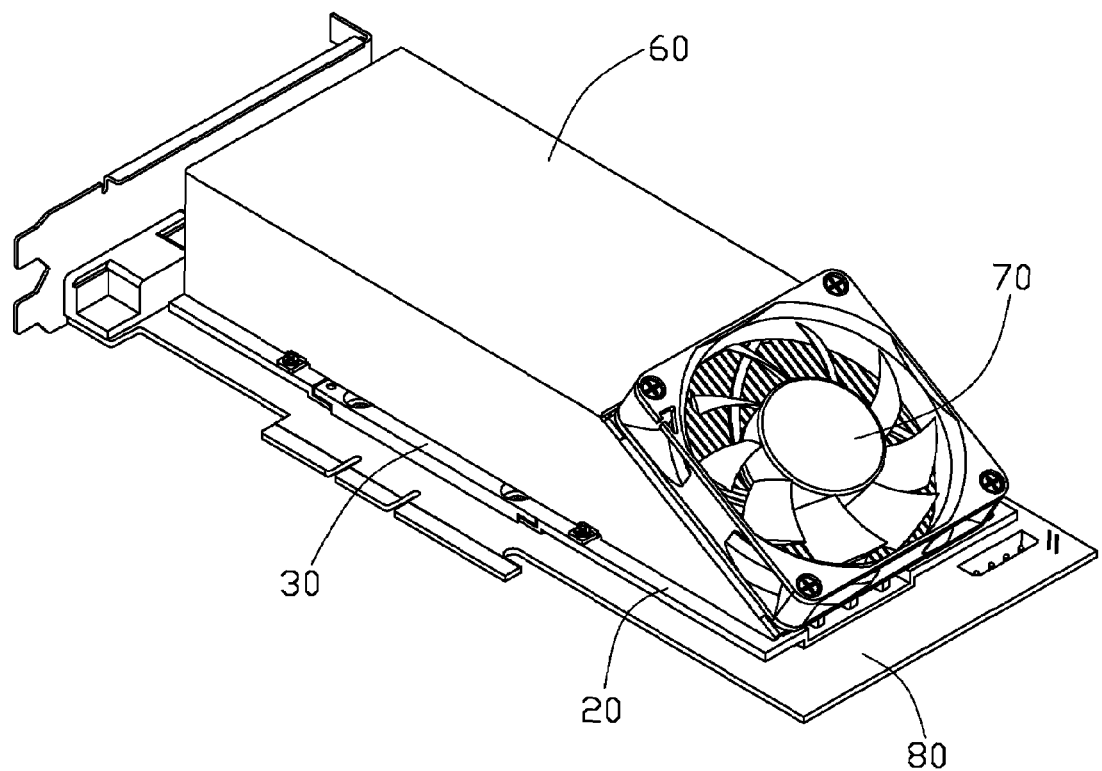
FIG. 1 is an assembled view of a heat dissipating apparatus according to a preferred embodiment of the present invention, shown together with an exemplary add-on device having a processor.
Figure 2:
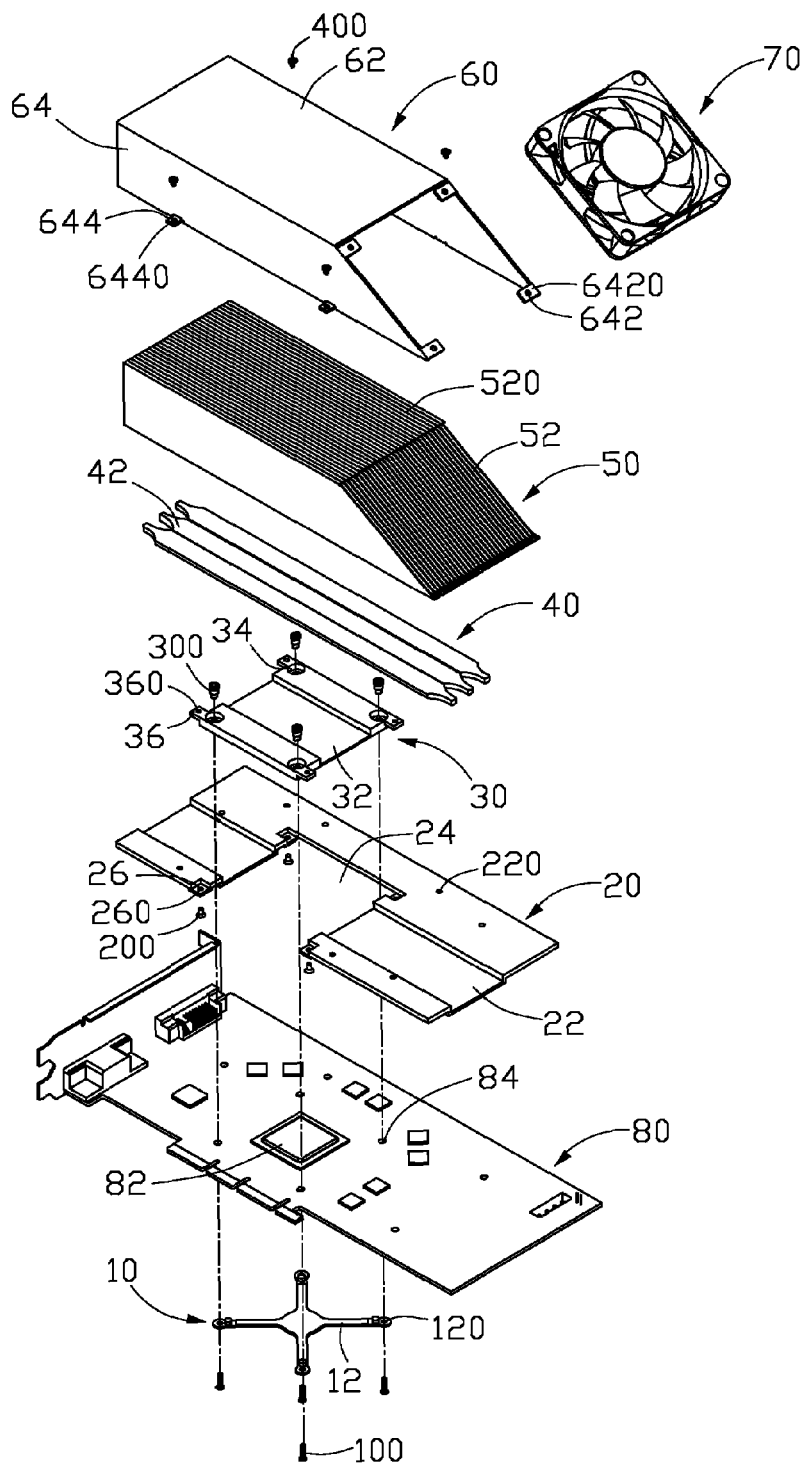
FIG. 2 is an exploded, isometric view of FIG. 1.

FIGS. 1 and 2 show a heat dissipating apparatus in accordance with a preferred embodiment of the present invention. The heat dissipating apparatus is shown mounted on an exemplary add-on device 80 such as a VGA card for dissipating heat generated by a processor 82 mounted on the add-on device 80. The heat dissipating apparatus includes a back plate 10 located beneath the add-on device 80, a base (not labeled) in contact with the processor 82, three heat pipes 40 disposed on the base, a fin set 50 arranged on the heat pipes 40, a fan duct 60 covering the fin set 50 and an axial fan 70 installed at a lateral side of the fin set 50.

The processor 82 is located in a central portion of the add-on device 80. The add-on device 80 symmetrically defines four mounting holes 84 around the processor 82, for allowing a plurality of screws 100 to extend therethrough to secure the heat dissipating apparatus thereon. A plurality of electronic components (not labeled) is located around the processor 82 on the add-on device 80.

The back plate 10 is mounted below the add-on device 80 and is positioned corresponding to the processor 82. The back plate 10 is integrally formed from a single piece of stainless steel. The back plate 10 has a central body (not labeled) and four fixing legs 12 symmetrically extending outwardly from four corners of the central body. The fixing legs 12 each defines a fixing hole 120 adjacent to a distal end thereof corresponding to the mounting hole 84 of the add-on device 80 for receiving the screw 100.

The base of the heat dissipating apparatus comprises a first plate 20 and a second plate 30 engaged with the first plate 20. The first plate 20 is substantially rectangular and made of a heat conductive material such as aluminum. The first plate 20 has a lengthways portion with a concave section, thereby defining a lengthways receiving groove 22 parallel and adjacent to a first lateral side (not labeled) thereof, for accommodating the heat pipes 40 therein. The first plate 20 defines a rectangular opening 24 extending from the first lateral side to a second lateral side (not labeled) opposite to the first lateral side until beyond the receiving groove 22, for receiving the second plate 30. The first plate 20 defines four rectangular step portions 26 respectively adjacent to four corners of the opening 24. The step portions 26 are formed by stamping the first plate 20 downwards and each define a fixing orifice 260 therein. The first plate 20 defines two pairs of mounting orifices 220 around the opening 24 and adjacent to the first and second lateral sides thereof for fixing the fan duct 60 thereto by screws 400.

The second plate 30 can be made of a heat conductive material with better heat conductivity than the first plate 20, such as copper. The second plate 30 is substantially rectangular and has a configuration consistent with that of the opening 24 of the first plate 20. The second plate 30 defines a receiving groove 32 in a middle portion thereof. The receiving groove 32 is located corresponding to and communicating with the receiving groove 22 of the first plate 20 when the second plate 30 is snugly accommodated in the opening 24 of the first plate 20. The second plate 30 defines four through holes 34 in four respective corners thereof for receiving sleeves 300 therein. The sleeves 300 have screw thread formed on an inner face thereof for receiving the screws 100, thus fixing the base on the add-on device 80. Each sleeve 300 comprises a wide portion and a narrow portion. The through holes 34 each match a corresponding sleeve 300 and define a step therein for supporting the sleeve 300 thereon. The second plate 30 has two pairs of spaced fixing ears 36 extending outwards from respective ends of two opposite lateral sides thereof. The fixing ears 36 each are rectangular and designed to be snugly supported on the corresponding step portions 26 of the first plate 20 and to hold top surfaces of the first and second plates 20, 30 essentially level with each other. The fixing ears 36 each define a fixing orifice 360 therein corresponding to the fixing orifice 260 of the corresponding step portion 26 for engaging with screw 200 to secure the first and second plates 20, 30 together.

The three heat pipes 40 each consist of elongated linear flat plates with capillary structure and phase-changeable media contained therein. The three heat pipes 42 are disposed side by side and thermally communicate with the receiving grooves 22, 32 after being attached to the base. Top surfaces of the three heat pipes 42, the first and second plates 20, 30 form a plane face for supporting the fin set 50 thereon after they are assembled.

The fin set 50 comprises a plurality of the fins 52. The fins 52 are spaced with each other and define a plurality of air passages therebetween. The fins 52 are held vertically on the plane face formed by the heat pipes 42 and the base, and parallel to the receiving grooves 22, 32 of the base after the fin set 50 is attached to the base. Each fin 52 has a main body (not labeled) and two flanges 520 extending perpendicularly from parallel upper and lower edges of the main body. The body of each fin 52 is substantially trapezium in shape. Corresponding flanges 520 of the fins 52 cooperatively form a top plane face (not labeled) and a bottom plane face (not labeled) for thermally contacting with the base. The body of each fin 52 has a beveled edge connecting the top edge and the bottom edge thereof. The beveled edges of the fins 52 are parallel to each other and cooperatively define an inclined plane area at the lateral side of the fin set 50. The inclined area is oriented at an acute angle to the base. The acute angle should be in an approximate range from 30-60 degrees for enabling the axial fan 70 installed onto the inclined area to direct airflow to the fins 52 and the second plate 30 where heat absorbed from the processor 82 accumulates.

The fan duct 60 covering the fins set 50, comprises a top wall 62 parallel to and spaced from the base and two sidewalls 64 extending downwardly from two opposite lateral edges of the top wall 62. The sidewalls 64 each define a beveled edge identical to that of the fins 52. The beveled edges of the sidewalls 52 each have two rectangular tabs 6420 extending perpendicularly and inwardly from two ends thereof. The tabs 6420 each define a mounting orifice 642 therein for mating with a fan fixture (not shown) to mount the axial fan 70 on the inclined plane at the lateral ends of the fins 52 of the fins set 50. The sidewalls 64 each have two spaced fixing eyelets 644 extending horizontally and outwardly from a bottom edge thereof. The fixing eyelets 644 each define a mounting orifice 6440 therein corresponding to the mounting orifice 220 of the first plate 20 for receiving the screw 400 to secure the fan duct 60 onto the first plate 20.

In assembly, the second plate 30 is snugly received in the opening 24 of the first plate 20 with the fixing ears 36 supported by the step portions 26 of the first plate 20. The heat pipes 42 are tightly received in the receiving grooves 22, 32 of the base. The fin set 52 is thermally attached to the base and the heat pipes 42 via soldering. The fan duct 60 covers the fin set 50 and is secured to the base by the screws 400 extending through the fixing eyelets 644 of the fan duct 60 to engage into the mounting orifices 220 of the first plate 20. The axial fan 70 is installed on the inclined area of the fin set 50 by the fan fixtures engaging in the mounting orifice 642 of the tabs 6420 of the fan duct 60. The axial fan 70 is in this way slantwise installed on the lateral side of the fin set 50 and at an acute angle to the base.

In use, the base is secured on the add-on device 80 with a bottom surface of the second plate 30 held in intimate contact with the processor 82 by the screws 100 extending through the fixing holes 120 of the back plate 10, the mounting holes 84 of the add-on device 80 and the fixing orifices 34 of the second plate 30 to engage with the sleeves 300. Heat generated by the processor 82 is absorbed by the second plate 30. Some of the heat in the second plate 30 is directly transferred to the fin set 50 and some is absorbed by the heat pipes 40 and is then transferred to the first plate 20 and the fin set 50. The axial fan 70 at the lateral side of the fin set 50 provides forced airflow to the fins 52 of the fin set 50. Because of the acute angle between the axial fan 70 and the base, the airflow from the axial fan 70 in the passages between the fins 52 is directed towards the base, more particularly toward the second plate 30 wherein more heat is accumulated, which results in the heat in the second plate 30, portions of heat pipes 40 and middle portions of the fins 52 corresponding to the second plate 30 being directly removed by the airflow. Furthermore, since the inclined plane has an area larger than that when the plane is vertically defined, the axial fan 70 can have a larger size thereby providing the airflow through the fins 52 with a larger flow rate to effectively remove the heat from the fins 52.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipating apparatus adapted for dissipating heat generated by a heat producing device, comprising:
    a base for contacting with a heat producing electronic element of the heat producing device;
    a fin set located on the base, comprising a plurality of fins, a plurality of passages defined between the fins, each of the fins having two opposite edges and a lateral inclined edge connecting the two opposite edges, the inclined edges of the fins defining an inclined plane at a lateral side of the fin set;
    an axial fan located on the inclined plane at the lateral side of the fin set and defining an acute angle to the base, for generating an airflow through the passages to the base; and
    a plurality of straight flat heat pipes sandwiched between the fin set and the base;
    wherein the base comprises a first plate and a second plate received in an opening defined in the first plate, the first plate and the second plate respectively define two corresponding receiving grooves communicating with each other; and
    wherein the plurality of straight flat heat pipes is wholly received in the receiving grooves of the first plate and the second plate of the base and connected to a bottom surface of the fin set.

2. The heat dissipating apparatus as described in claim 1, wherein the axial fan is inclined toward the base at an angle to the base in an approximate range from 30-60 degrees.

3. The heat dissipating apparatus as described in claim 1, wherein the second plate is made of a material with higher heat conductivity than that of the first plate.

4. The heat dissipating apparatus as described in claim 3 wherein the first plate is made of aluminum.

5. The heat dissipating apparatus as described in claim 4 wherein the second plate is made of copper.

6. The heat dissipating apparatus as described in claim 1, further comprising a fan duct covering the fin set, wherein the fan duct has two beveled edges corresponding with the inclined plane of the fin set, and the beveled edges each have two rectangular tabs extending perpendicularly and inwardly from two ends thereof to secure the axial fan on the inclined plane.

7. A heat dissipating apparatus adapted for dissipating heat from a heat producing device, comprising:
- a base for being secured on the heat producing device and thermally engaging with a heat generating electronic component of the heat producing device;
- a fin set comprising a plurality of fins arranged on the base, the fins spaced and parallel to each other, wherein a plurality of air passages are defined between the fins;
- an axial fan installed at a lateral side of the fin set for providing airflow to the fin set through the air passages; and
- a plurality of straight flat heat pipes thermally connected with the base and the fins;
- wherein the fin set defines an inclined area at an end thereof, the axial fan is installed on the inclined area of the fin set and inclined to the base;
- wherein the base comprises a first plate and a second plate received in an opening defined in the first plate, the first plate and the second plate respectively define two corresponding receiving grooves communicating with each other; and
- wherein the plurality of straight flat heat pipes is wholly received in the receiving grooves of the first plate and the second plate of the base and connected to a bottom surface of the fin set.

8. The heat dissipating apparatus as described in claim 7, wherein each of the fins of the fin set has an inclined edge at the lateral side of the fin set, the inclined edges of the fins cooperatively define the inclined area, and the axial fan is located on the inclined area.

9. The heat dissipating apparatus as described in claim 7, wherein the axial fan is oriented at an oblique angle to the base in an approximate range from 30-60 degrees.

10. The heat dissipating apparatus as described in claim 7, wherein the second plate is made of a more highly heat conductive material than that of the first plate.

11. The heat dissipating apparatus as described in claim 10, wherein the first and second plates are respectively made of aluminum and copper.

12. The heat dissipating apparatus as described in claim 7, further comprising a fan duct covering the fin set, the fan duct has two beveled edges corresponding to the inclined area of the fin set, and the beveled edges each extend two tabs for securing the axial fan on the inclined area.

13. A computer add-on card comprising:
- a processor which generates heat when operates;
- a base mounted on a top surface of the processor and thermally connecting therewith;
- a plurality of fins extending upwardly from the base, wherein the fins each have an inclined lateral side, the inclined lateral sides cooperatively defining an inclined plane;
- an axial fan mounted on the inclined plane and at an inclined angle to the base, an airflow generated by the axial fan flowing through the fins to the base; and
- a plurality of straight flat heat pipe;
- wherein the base comprises a first plate and a second plate received in an opening defined in the first plate, the first plate and the second plate respectively define two corresponding receiving grooves communicating with each other; and
- wherein the plurality of straight flat heat pipes is wholly received in the receiving grooves of the first plate and the second plate of the base and connected to a bottom surface of the fin set.

14. The computer add-on card as described in claim 13 further comprising a fan duct covering the fins, the fan duct having a top wall on tops of the fins, front and rear walls extending downwardly from the top wall and covering front and rear sides of the fins, the front and rear walls each having an inclined lateral side, the axial fan being also mounted on the inclined lateral sides of the fan duct.

15. The computer add-on card as described in claim 14 wherein the second plate has a thermally conductivity higher than that of the first plate.

\* \* \* \* \*